United States Patent
Doering et al.

(10) Patent No.: US 8,641,999 B2
(45) Date of Patent: Feb. 4, 2014

(54) CARBON GRIT

(75) Inventors: Patrick J. Doering, Holliston, MA (US);
Alfred Genis, East Douglas, MA (US);
Robert C. Linares, Sherborn, MA (US);
John J. Calabria, Maynard, MA (US)

(73) Assignee: SCIO Diamond Technology Corporation, Greer, SC (US)

( * ) Notice: Subject to any disclaimer, the term of this patent is extended or adjusted under 35 U.S.C. 154(b) by 1384 days.

(21) Appl. No.: 11/178,622

(22) Filed: Jul. 11, 2005

(65) Prior Publication Data

US 2007/0009419 A1    Jan. 11, 2007

(51) Int. Cl.
*B01J 3/06* (2006.01)
*C01B 31/02* (2006.01)
*B03C 1/00* (2006.01)
*C23C 16/00* (2006.01)
*C01B 31/00* (2006.01)
*C30B 29/00* (2006.01)

(52) U.S. Cl.
USPC ........ 423/446; 423/461; 423/156; 427/249.7; 427/249.8; 204/173; 501/86

(58) Field of Classification Search
USPC ......................................................... 423/446
See application file for complete search history.

(56) References Cited

U.S. PATENT DOCUMENTS

| | | | | |
|---|---|---|---|---|
| 4,434,188 A | * | 2/1984 | Kamo et al. | 427/575 |
| 5,075,094 A | * | 12/1991 | Morrish et al. | 427/585 |
| 5,200,231 A | * | 4/1993 | Bachmann et al. | 427/573 |
| 5,364,423 A | * | 11/1994 | Bigelow et al. | 51/293 |
| 5,370,912 A | * | 12/1994 | Bigelow et al. | 427/575 |
| 5,474,021 A | * | 12/1995 | Tsuno et al. | 117/97 |
| 5,491,002 A | * | 2/1996 | Slutz | 427/249.14 |
| 5,516,554 A | * | 5/1996 | Gasworth | 427/249.11 |
| 5,540,904 A | * | 7/1996 | Bovenkerk et al. | 423/446 |
| 5,628,824 A | * | 5/1997 | Vohra et al. | 117/101 |
| 5,961,718 A | * | 10/1999 | Chen et al. | 117/94 |
| 6,322,891 B1 | * | 11/2001 | Meng et al. | 428/402 |
| 7,157,067 B2 | * | 1/2007 | Hemley et al. | 423/446 |
| 7,258,741 B2 | * | 8/2007 | Linares et al. | 117/86 |
| 2005/0056209 A1 | * | 3/2005 | Linares et al. | 117/68 |

FOREIGN PATENT DOCUMENTS

| | | | |
|---|---|---|---|
| CN | 1235122 A | * | 11/1999 |
| EP | 0588260 A2 | | 3/1994 |
| JP | 10081590 A | | 3/1998 |

OTHER PUBLICATIONS

Show et al.; Characterization and Electrochemical Responsiveness of Boron-Doped Nanocrystalline Diamond Thin-Film Electrodes; Chem. Mater. 15, 879-888.*

(Continued)

*Primary Examiner* — Guinever Gregorio
(74) *Attorney, Agent, or Firm* — Schwegman, Lundberg & Woessner, P.A.

(57) ABSTRACT

Plasma assisted chemical vapor deposition is used to form single crystal diamond from a seed and methane. A susceptor is used to support the seed. Under certain conditions, crystalline grit is formed in addition to the diamond. The crystalline grit in one embodiment comprises mono crystals or twin crystals of carbon, each having its own nucleus. The crystals form in columns or tendrils to the side of the monocrystalline diamond or off a side of the susceptor. The crystals may have bonding imperfections which simulate doping, providing conductivity. They may also be directly doped. Many tools may be coated with the grit.

21 Claims, 2 Drawing Sheets

(56) References Cited

OTHER PUBLICATIONS

Lee and Iam; "Pressure Effect on Diamond Nucleation in a Hot-Filament CVD System", Physical Review B, 55(23): 15937-15941, Jun. 15, 1997.*

Anthony, J. M., "Ion Beam Characterization of Semiconductors", *In: Semiconductor Characterization: Present Status and Future Needs*, eds. W.M. Bullis, D.G. Seiler, and A.C. Dibold, AIP Press, (1996), 366-376.

Bartels, W. J., "Characterization of thin layers on perfect crystal with a multipurpose high resolution X-ray diffractometer", *Journal of Vacuum Science & Technology B (Microelectronics Processing and Phenomena)*, 1(2), (Apr.-Jun. 1983), 338-45.

Blakemore, J. S., "", *Semiconductor Statistics*, Pergamon Press, Inc., New York, NY, (1962), 4 pgs.

Boer, K. W., "",*Survey of Semiconductor Physics*, New York: Van Nostrand Reinhold, (1990), 29 pgs.

Brunet, F., et al., "Effect of boron doping on the lattice parameter of homoepitaxial diamond films", *Diamond and Related Materials*, 7(6), (Jun. 1998), 869-873.

Clark, C. D., et al., "Chapter 2—Absorption and Luminescence Spectroscopy", *The Properties of Natural and Synthetic Diamond*, ed. J.E. Field, Academic Press, (1992), 35-79.

Collins, A. T., et al., "Indirect Energy Gap of (13)C Diamond", *Physical Review Letters*, 65, (1990), 891-894.

Graebner, J. E., "Thermal Measuremnt Techniques", *Handbook of Industrial Diamond and Diamond Films*, eds. M.A. Prelas, G. Popovici, and L.K. Bigelow, Marcel Dekker, Inc., (1998), 193-226.

Grovenor, C. R., "Microelectronic Materials", *Philadelphia*: A. Hilger, (1989), 80 pgs.

Hass, K. C., et al., "Lattice dynamics and Raman spectra of isotopically mixed diamond", *Physical Review B (Condensed Matter)*, 45(13), (Apr. 1992), 7171-82.

Holloway, H., et al., "Erratum: Isotope dependence of the lattice constant of diamond", *Physical Review*, B45, (1992), 6353.

Klemens, P. G., "Thermal Conductivity and Lattice Vibrational Modes", *In: Solid State Physics: Advance in Research and Applications*, vol. 7, Seitz F., et al., Editors, Academic Press, Inc., New York, NY, (1958), 1-98.

U.S. Appl. No. 09/312,326, Advisory Action mailed Jan. 29, 2002, 3 pgs.

U.S. Appl. No. 09/312,326, Examiner Interview Summary mailed Jul. 12, 2001, 1 pg.

U.S. Appl. No. 09/312,326, Final Office Action mailed Jun. 28, 2001, 6 pgs.

U.S. Appl. No. 09/312,326, Non Final Office Action mailed Feb. 26, 2003, 4 pgs.

U.S. Appl. No. 09/312,326, Non Final Office Action mailed Jun. 20, 2000, 5 pgs.

U.S. Appl. No. 09/312,326, Non Final Office Action mailed Dec. 22, 2000, 5 pgs.

U.S. Appl. No. 09/312,326, Notice of Allowance mailed Mar. 24, 2003, 8 pgs.

U.S. Appl. No. 09/312,326, Response filed Apr. 20, 2001 to Non Final Office Action mailed Dec. 20, 2000, 2 pgs.

U.S. Appl. No. 09/312,326, Response filed Aug. 26, 2002 to Advisory Action mailed Jan. 29, 2002, 2 pgs.

U.S. Appl. No. 09/312,326, Response filed Sep. 20, 2000 to Non Final Office Action mailed Jun. 20, 2000, 8 pgs.

U.S. Appl. No. 09/312,326, Response filed Oct. 29, 2001 to Final Office Action mailed Jun. 28, 2001, 2 pgs.

\* cited by examiner

__US 8,641,999 B2__

CARBON GRIT

RELATED APPLICATION

This application is related to U.S. Pat. No. 6,582,513 issued Jun. 24, 2003, titled "System and Method for Producing Synthetic Diamond."

FIELD

The present invention relates to forming diamond, and in particular to forming a carbon grit.

BACKGROUND

Diamond grit has long been used to polish diamond and other materials. Harder grits are desired to decrease the time needed to polish diamond, and may also make it easier to control polishing time. Further uses include coatings for cutting tools, such as saws, drills and other types of grinding or polishing tools. It may even be used on plywood. Drill bits have also used diamond coatings to increase their effectiveness and life span. The harder the grit, the longer the life of the tool, and the greater effectiveness or efficiency of the tool. Such tools may also be used to cut mined or manufactured diamond. There is a need for even harder forms of grit to further increase effectiveness and life of tools. Increased tool life also leads to reduced time required for replacement and recalibration, longer production runs, improved product specifications, and overall increased production lots.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. In the example embodiments, the methods include element that are arranged serially. However, in other embodiments, the elements may be performed in a different order, or simultaneously. The following description is, therefore, not to be taken in a limited sense, and the scope of the present invention is defined by the appended claims.

By "doped", as used herein, it is meant that at least one layer within a composition of this invention has been grown with an amount of one or more impurities, e.g., incorporated into the gas stream, in order to bring about an amount of an impurity, such as boron, phosphorous, carbon isotopes, or lithium in the synthetic diamond layer, sufficient to produce a measurable change in the electrical, physical, optical, electronic or crystallographic properties. By "undoped" it is meant that the layer has substantially no boron (or other impurities), such that the layer has all the attributes described above.

Figure 1:
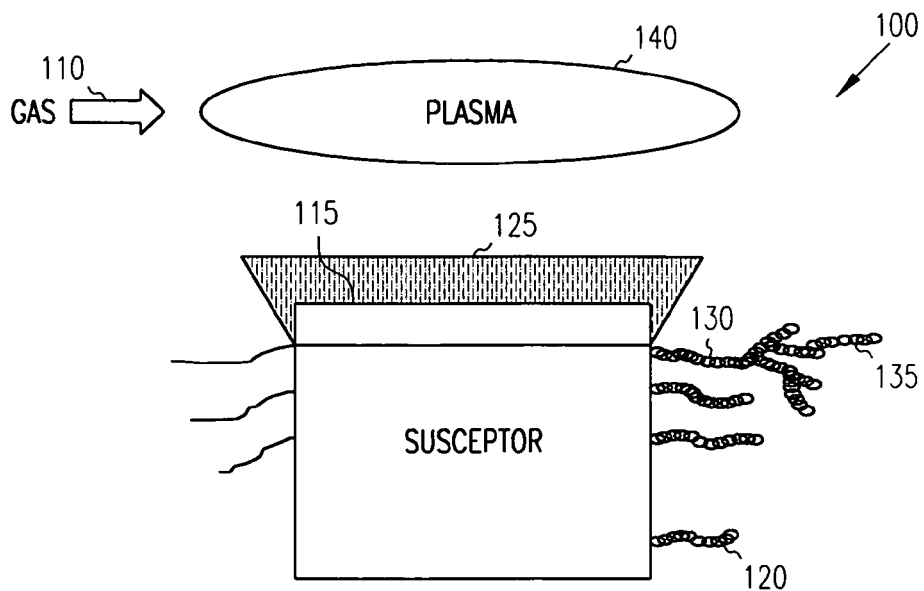
FIG. 1 is a cross section illustrating carbon grit formation using chemical vapor deposition according one example embodiment of the present invention.

Plasma assisted chemical vapor deposition is used at 100 in FIG. 1 to form diamond from methane 110. A seed 115 is mounted on a susceptor 120. Seed 115 may cover part of or substantially the entire top surface of the susceptor 120 as shown in FIG. 1 in one embodiment. In various embodiments, the seed may be polycrystalline diamond, monocrystalline diamond, or the susceptor 120 itself. Under certain conditions, polycrystalline crystallites or grit 125 is formed on the seed. The polycrystalline grit in one embodiment comprises mono crystals of diamond, each having its own nucleus. Further mono crystals form in columns or tendrils 130, 135 off of the sides or top of the susceptor 120 Tendrils 135 are coral like in shape in one embodiment.

Susceptor 120 is formed of molybdenum in one embodiment. In further embodiments, it may be formed of silicon, tungsten, tantalum or other materials that can withstand desired process parameters, such as different types of carbides. If a seed is used, it may also be formed of one of the materials listed with respect to the susceptor.

In one embodiment, the tendrils 130 form on sides or top of a susceptor used to hold the seed in a CVD (chemical vapor deposition) chamber. The susceptor 120 is heated in one embodiment to a temperature of between 600 to 2000° C. Methane gas is supplied at percentages ranging from approximately 1% to 25% and is heated to form a plasma cloud 140 at approximately several thousand ° C. Such conditions have resulted in the growth of different forms of the crystalline grit on polycrystalline seeds. Concentrations of methane or other carbon containing gas may be varied further, and in one embodiment may be as low as 0.1% or higher than 25%. Grit forms in the presence of atomic hydrogen and carbon proximate the seed and/or susceptor.

Figure 2:
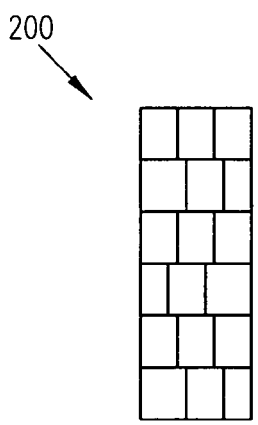
FIG. 2 is a cross section of a column of carbon grit according one example embodiment of the present invention.
Figure 3:
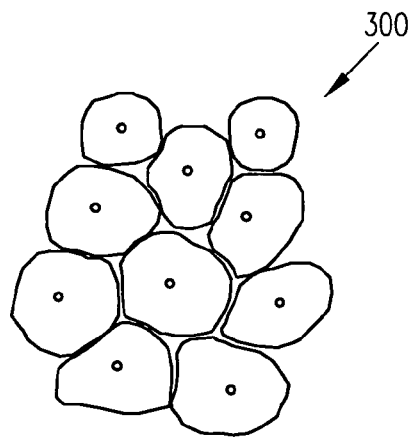
FIG. 3 is a cross section of a cluster of carbon grit according one example embodiment of the present invention.

Tendrils appear to be made of columns 200, as illustrated in FIG. 2, of textured single or twin crystals, wherein the columns constantly mutate new crystals. In some instances, a cauliflower like growth 300 in FIG. 3 of the crystalline grit results. Tendrils may be fan shaped, branched, straight, curved, or may follow convection lines in various embodiments. Once formed, the surface temperature of the tendrils rises. Surface temperatures between 1200 and 2000° C. have been observed.

During a nucleation phase of grit, some tendrils may get crowded out, both on the sides of the susceptor 120 and in the layer of grit 125. Nucleation sites can be enhanced by polishing, such as by rubbing or grinding the seed with diamond powder. In further embodiments, spreading already formed and ground up grit on the susceptor prior to growth can enhance the nucleation sites without the need for a separate distinct seed.

In one embodiment, the crystalline grit contains less than 10 ppm $N_2$. The grit appears to increase in hardness with lower concentrations of $N_2$. The wear rate of the grit during use to cut or polish materials appears to be proportional to the amount of $N_2$ in the grit. Boron doping may also be used to further increase the hardness of the grit. Different ratios of carbon isotopes may also be used to form the grit. Further details and prophetic process examples are described below. Growing the grit at faster rates leads to an increase in defects and dislocations in the crystalline structure of the grit. This in turn appears to make the grit even harder. Growth rates of 1 to 100 mm per hour have been observed under varying CVD parameters.

Figure 4:
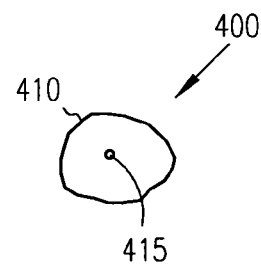
FIG. 4 is a cross section of a mono crystal of carbon grit according one example embodiment of the present invention.
Figure 5:
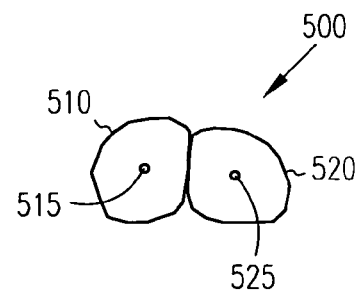
FIG. 5 is a cross section of a twin crystal of carbon grit according one example embodiment of the present invention.

The resulting polycrystalline crystallites or grit, sometimes referred to as CVD carbon grit, or diamond grit, may be separated from the diamond and susceptor, and oxygen or acid etched to separate it into small monocrystals 400 in FIG. 4, or twin crystals 500 in FIG. 5 for use as a grit. Monocrystals comprise a body 410 and a nucleus 415. Twin crystals comprise two bodies 510 and 520 with corresponding nuclei 515 and 525.

In one embodiment, the separated crystalline grit is boiled in sulfuric acid with an oxidizing agent. This process separates the crystals.

In one embodiment, the grit is crushed and run through a sieve or other separation process. It may then be micronized. One micronization process involves tumbling the separated grit with steel balls in oil, water or other fluid. Different tumbling actions may be used to obtain different shapes and sizes of the grit. Generally, smaller grits tend to polish diamond faster than larger sizes of grit.

The resulting grit is harder than natural diamond grit, in that it can take ten times longer to be polished using common polishing techniques. In one embodiment, the grit polishes at a rate of less than approximately $\frac{1}{10}^{th}$ that of mined diamond or nitrogen containing synthetic diamond such as those produced by high pressure, high temperature techniques.

In one embodiment, the grit comprises nano-clusters of carbon having a hardness greater than mined diamond or diamond formed using high temperature and high pressure techniques. The nano-clusters of crystals have bonding imperfections which may simulate semiconductor doping. The bonding imperfections create holes in one embodiment such that they become conductive.

In a further embodiment, the grit consists of single and/or twin nano-crystals of carbon having a hardness greater than mined diamond. Each crystal has a nucleus and is harder in a 111 plane than in a 100 plane.

Hard grit may be used to polish diamonds in one embodiment. Such grit may be used to polish other materials, or may be coated onto saws or other cutting or polishing tools. Due to the extra hardness obtained by the processes described herein, time to polish can be decreased, making it easier to control or estimate polish times. Heat generated during such polishing may also be reduced because less force and less friction are required. This can lead to a reduction in heat induced color changes in the diamond being polished, or less heat being generated by tools that are coated with the grit. Even if the cost of the grit is higher, it may be more than offset by reduction in machine times, labor time and the amount of grit required. Reduced grinding or polishing time may result in reduced energy consumption to provide the desired surface finish or to remove a desired amount of material.

Further uses of the grit include potential use as taggants. Isolated micro/nano crystals of grit may also be used, and may include N-V centers for use as Qubits in quantum computing applications.

Figure 6:
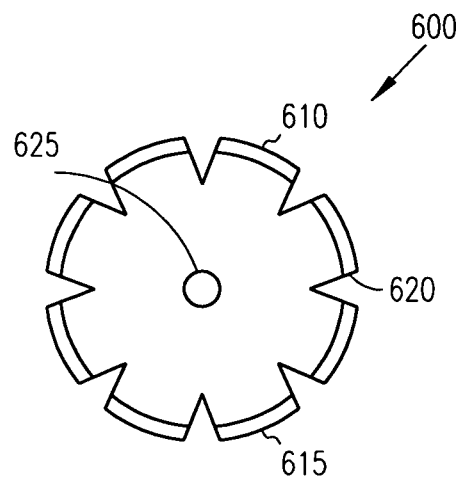
FIG. 6 is a diagram of a saw having a grit coating according one example embodiment of the present invention.

Several different tools may have coatings of the grit applied to them to improve their characteristics, including hardness, sharpness and life. In FIG. 6, a saw is illustrated generally at 600. The saw included an outer edge or surface 610 that includes a coating of grit indicated at 615. Several grooves are formed in the saw as indicated at 620 in one embodiment. In further embodiments, the grooves may be many different shapes and sizes, and may not even be used if desired.

The coating of grit in one embodiment extends part way from the outer edge of the saw to a middle opening indicated at 625 for coupling to a motor or other driving device. The extent of the grit in one embodiment, is designed to provide a working surface for cutting or removing material in an object being sawed. It may extend as shown, or may cover a larger area of the saw, such as the entire surface to the opening 625. In still further embodiments, the grit may be coated just on the outside edge of the saw at 610.

The grit is attached to the tool and other tools by means of adhesive or heat. The underlying material of the saw may be any material currently already used for existing forms of industrial diamond, as may the means of rearing adhering the grit to the tool.

Figure 7:
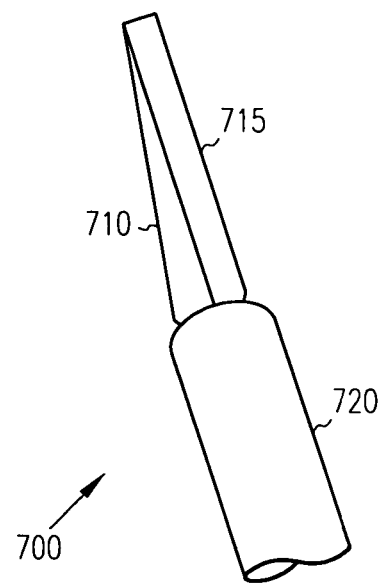
FIG. 7 is a diagram of a knife having a grit coating according one example embodiment of the present invention.

FIG. 7 illustrates a knife or scalpel at 700. The scalpel includes a blade 710 and a sharpened edge or working surface 715 coated with grit. The blade 710 is supported by a handle 720 in a common manner. The grit coating may extend partially or fully on the working surface, and may also extend to the entire blade if desired.

Figure 8:
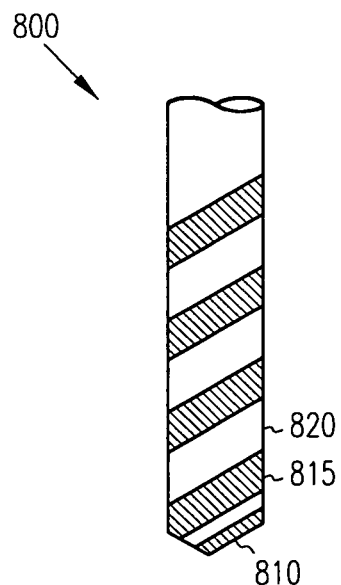
FIG. 8 is a diagram of a drill bit having a grit coating according one example embodiment of the present invention.

FIG. 8 illustrates a drill bit 800. The drill bit comprises a tip 810 and working surface 820. Furrows 815 provide for removal of material during use of the drill bit 800. In one example, the tip 810 is part of the working surface which is coated with grit. In other embodiments, just the working surface 820 is coated with grit. Many other types of drill bits may be used, such as general purpose twist bits, core drill bits, brad point bits, spade bits, adjustable wood bits, concrete, auger bits, forstner bits, drill saw bits, counterbore, pilot and countersink bits, installer bits, left hand bits, masonry bits, glass/tile bits step bits and scaling chisel bits to name a few. All are deemed represented by the bit 800 in FIG. 8.

Figure 9:
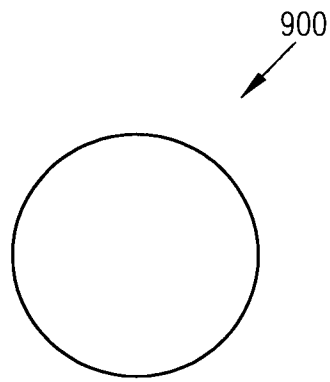
FIG. 9 is a diagram of a pad having a grit coating according one example embodiment of the present invention.

FIG. 9 illustrates a pad 900 than can be used as a sanding or polishing pad. The entire surface of a side of the pad that is shown may be coated with grit in one embodiment, or selected portions if desired. The other side of the pad not shown has means for attaching to a rotary or other type of driving device.

This application is related to U.S. Pat. No. 6,582,513 entitled: "System and Method for Producing Synthetic Diamond", which is incorporated herein by reference at least for its teaching of different methods of forming carbon based crystals from a carbon containing gas. Many of the examples therein may be modified according to the teaching herein to result in the formation of carbon grit.

The following prophetic example is provided to illustrate the variety of conditions under which the carbon based grit may be formed. Further variations in the processes will be apparent from the example.

Growth of Grit Using Various Plasma Methods

A metal substrate of varied thickness may be cleaned with hot detergent in an ultrasonic cleaner, rinsed in acetone and dried. Other methods of cleaning the substrate may be used. Substrate materials include, but are not limited to nobel metals, such as molybdenum, tungsten, tantalum and other materials, such as silicon. The substrate may be polished, and the surface may be roughened such as by sand blasting and polishing with a diamond grit to create multiple nucleation points. Some diamond particles may be left behind and embedded into the surface of the substrate. Nucleation sites may also be created by thermal cycling of the substrate to create cracks in the surface.

Following cleaning the substrate is placed in a microwave plasma reactor (MWCVD), RF, DC ArcJet or other type of reactor capable of producing a plasma cloud. In one embodiment, the reactor is evacuated to a pressure of less than 10 millitorr and then backfilled to a pressure of 40 torr with hydrogen having a purity of at least approximately 99.9% and at a rate of 100 sccm. Other flow rates may be used, and may depend on the volume of the machine and area of substrate to be coated.

Power may be applied to the reactor to achieve a plasma ball and a substrate temperature of at least approximately 900 degrees C., which may be measured by a disappearing filament optical pyrometer. After stabilizing the plasma power and substrate temperature for five minutes methane gas and optionally diborane if boron doping is desired, is added to the gas stream so that the final mixture is approximately 99% hydrogen and 1% methane, optionally containing 1000 ppm or other amount of diborane while maintaining the total gas flow at 100 sccm.

The total gas flow rate may be varied in further embodiments. It may be a function of areas of the substrate and volume of grit per unit time desired. The ratio and supply of gas may be maintained constant if desired to create the volume of diamond desired. Recirculation of gas may be done in further embodiments.

In one embodiment, the methane amount of the mixture may be varied between 0.1 and 25%. Other hydrocarbon gases or fluids may be used, such as ethane, butane, propane, acetylene, or oxygen containing hydrocarbons, such as CO, $CO_2$, ethanol, acetone and mixtures thereof.

Part of the hydrogen is converted to atomic hydrogen in the plasma and the methane decomposes in the presence of the atomic hydrogen on the substrate surface to form a layer of diamond. Growth is maintained for 250 hours at a rate of 1 micrometer per hour to form a diamond 250 micrometers thick. If boron is included, the diamond may be boron doped. At the end of this time, the optional diborane flow may be terminated, and the methane flow continued for an additional 75 hours. At the end of this time period the methane flow is terminated, the power is terminated and the substrate with film may be cooled to room temperature. At this point the reactor may be evacuated to remove all hydrogen and then filled with room air to atmospheric pressure.

Different growth rates may be obtained by varying the above parameters. In particular, a methane concentration of 10% may result in a growth rate of 100 um per hour, which a 20% concentration may result in a growth rate of 200 um per hour. Further, tendrils tend to grow at different rates. A 400 hour run may result in tendrils that are approximately 100 mm long.

The substrate with the attached diamond film may be removed and cleaned in a mixture of nitric acid and sulfuric acid at temperature of 250.degree. C. to remove residual non diamond carbon from the diamond surface, leaving a diamond layer 250 micrometer thick. As previously described, the diamond may be crushed, recleaned and separated into various particle sizes, such as by use of sieves or liquid or gas phase elutriation methods. Example particle sizes are 1 micron to 100 micron or larger sizes.

During the above process, or separately, tendrils may be formed. The tendrils may be ground up and used to seed the substrate, such as by sprinkling them on the substrate in an evaporative liquid dispersant.

The invention claimed is:
1. A method comprising:
creating nucleation sites on a substrate;
wherein the creating nucleation sites includes polishing the substrate with diamond grit and leaving some diamond grit particles embedded in the substrate, and wherein the diamond grit comprises diamond monocrystals;
evacuating a CVD (chemical vapor deposition) chamber and backfilling the chamber to about 40 torr with hydrogen;
heating a susceptor in the chamber to a temperature of at least approximately 600° C.;
applying power to a heat source;
supplying a carbon source and a boron source to form a plasma proximate the heat source;
forming atomic hydrogen proximate the susceptor; and
growing carbon crystal grit comprising carbon and boron on the substrate about the nucleation sites.

2. The method of claim 1 wherein the carbon crystal grit forms diamond monocrystals in columns or tendrils.

3. The method of claim 2 wherein the monocrystals have their own nucleus.

4. The method of claim 1 wherein the carbon crystal grit forms diamond monocrystals in a cauliflower type shape.

5. The method of claim 1 wherein the carbon crystal grit comprises dense micro/nano crystal clusters.

6. The method of claim 1 wherein the carbon crystal grit comprises twin crystals.

7. The method of claim 1 and further comprising growing a monocrystalline diamond on the seed, and wherein the carbon crystal grit forms on sides of the monocrystalline diamond.

8. A method comprising:
creating nucleation sites on a substrate;
wherein the creating nucleation sites includes polishing the substrate with diamond grit and leaving some diamond grit particles embedded in the substrate, and wherein the diamond grit comprises diamond monocrystals;
evacuating a CVD (chemical vapor deposition) chamber and backfilling the chamber to about 40 torr with hydrogen;
heating a susceptor in the chamber to a temperature of at least approximately 600° C.;
applying power to a heat source;
supplying boron and a gas including at least approximately at least 1% methane to form a plasma proximate the heat source; and
growing carbon crystal grit comprising carbon and boron.

9. A method comprising:
creating nucleation sites on a substrate by thermal cycling of the substrate to create cracks in the substrate;
growing carbon crystal grit on the substrate in a plasma assisted CVD chamber with a supply gas of approximately 18% to 25% methane heated to form a plasma cloud, wherein the grit comprises carbon and boron and wherein the carbon crystal grit is thermally distinct from the susceptor.

10. The method of claim 9 and further comprising adding borane to the CVD chamber.

11. The method of claim 9 wherein the carbon crystal grit is grown at a rate of between approximately 20 to 50 um/hour.

12. The method of claim 9 wherein the carbon crystal grit is grown in the form of nano-crystals.

13. The method of claim 12 wherein the nano-crystals comprise bonding imperfections.

14. The method of claim 13 wherein the bonding imperfections create holes for conductivity.

15. The method of claim 9 wherein the carbon crystal grit is conductive.

16. The method of claim 9 and further comprising polishing the grown carbon crystal grit.

17. The method of claim 16 wherein the carbon crystal grit polishes at approximately 1/10 the rate of synthetic diamond.

18. The method of claim 16 wherein the carbon crystal grit is polished in a 100 plane.

19. The method of claim 9 wherein the methane contains controlled amounts of different carbon isotopes.

20. A method comprising:
- roughening a surface of a substrate to create multiple nucleation points including embedding diamond particles in the substrate;
- heating the substrate in a CVD (chemical vapor deposition) chamber to a temperature of at least approximately 600° C.;
- applying power to a heat source;
- supplying a carbon source and a boron source to form a plasma proximate the heat source;
- forming atomic hydrogen proximate the substrate; and
- growing carbon crystal grit comprising carbon and boron.

21. The method of claim 20 wherein the carbon crystal grit comprises nano-clusters of carbon having a hardness greater than mined diamond.

* * * * *

UNITED STATES PATENT AND TRADEMARK OFFICE
CERTIFICATE OF CORRECTION

PATENT NO. : 8,641,999 B2  
APPLICATION NO. : 11/178622  
DATED : February 4, 2014  
INVENTOR(S) : Doering et al.

It is certified that error appears in the above-identified patent and that said Letters Patent is hereby corrected as shown below:

In the Specification

In column 2, line 17, delete "of" and insert --of,--, therefor

In column 2, line 26, delete "120" and insert --120.--, therefor

In column 2, line 34, delete "130" and insert --135--, therefor

In column 4, line 17, after "of", delete "rearing", therefor

In column 5, line 46, delete "um" and insert --μm--, therefor

In column 5, line 47, delete "um" and insert --μm--, therefor

In column 5, line 53, delete "250.degree. C." and insert --250° C.--, therefor

In column 5, line 59, delete "micron" and insert --microns--, therefor

In the Claims

In column 6, line 42, in Claim 8, after "including", delete "at least", therefor In column 6, line 58, in Claim 11, delete "um/hour." and insert --μm/hr.--, therefor Signed and Sealed this  
Nineteenth Day of August, 2014

Michelle K. Lee  
*Deputy Director of the United States Patent and Trademark Office*